(12) United States Patent
Malshe et al.

(10) Patent No.: US 11,615,858 B2
(45) Date of Patent: Mar. 28, 2023

(54) MEDIA MANAGEMENT OPERATIONS BASED ON HEALTH CHARACTERISTICS OF MEMORY CELLS

(71) Applicant: Micron Technology, Inc., Boise, ID (US)

(72) Inventors: Ashutosh Malshe, Fremont, CA (US); Vamsi Pavan Rayaprolu, San Jose, CA (US); Kishore K. Muchherla, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 36 days.

(21) Appl. No.: 17/341,830

(22) Filed: Jun. 8, 2021

(65) Prior Publication Data
US 2022/0392558 A1 Dec. 8, 2022

(51) Int. Cl.
*G06F 11/10* (2006.01)
*G06F 11/34* (2006.01)
(Continued)

(52) U.S. Cl.
CPC ...... *G11C 16/3495* (2013.01); *G06F 12/0891* (2013.01); *G11C 16/102* (2013.01);
(Continued)

(58) Field of Classification Search
CPC ... G11C 16/3495; G11C 16/102; G11C 16/16; G11C 16/26; G06F 12/0891;
(Continued)

(56) References Cited

U.S. PATENT DOCUMENTS

| 2014/0231954 A1 | 8/2014 | Lue | |
| 2015/0205664 A1* | 7/2015 | Janik | G06F 11/1012 714/764 |

(Continued)

FOREIGN PATENT DOCUMENTS

WO 2017074570 A1 5/2017

OTHER PUBLICATIONS

Choudhuri, et al., "Performance Improvement of Block Based NAND Flash Translation Layer", retrieved from https://www.ics.uci.edu/~givargis/pubs/C32.pdf., Sep. 30-Oct. 3, 2007, 6 pages.

*Primary Examiner* — Ly D Pham
(74) *Attorney, Agent, or Firm* — Brooks, Cameron & Huebsch, PLLC

(57) ABSTRACT

A method includes determining that a ratio of valid data portions to a total quantity of data portions of a block of memory cells is greater than or less than a valid data portion threshold and determining that health characteristics for the valid data portions of the block of memory cells are greater than or less than a valid data health characteristic threshold. The method further includes performing a first media management operation on the block of memory cells in response to determining that the ratio of valid data portions to the total quantity of data portions is greater than the valid data portion threshold and performing a second media management operation on at least a portion of the block of memory cells in response to determining that the ratio of valid data portions to the total quantity of data portions is less than the valid data portion threshold and the health characteristics for the valid data portions are greater than the valid data health characteristic threshold.

20 Claims, 5 Drawing Sheets

(51) Int. Cl.
*G06F 16/11* (2019.01)
*G06F 16/16* (2019.01)
*G06F 16/17* (2019.01)
*G06F 3/06* (2006.01)
*G06F 12/02* (2006.01)
*G11C 16/34* (2006.01)
*G11C 16/10* (2006.01)
*G11C 16/16* (2006.01)
*G06F 12/0891* (2016.01)
*G11C 16/26* (2006.01)

(52) U.S. Cl.
CPC .............. *G11C 16/16* (2013.01); *G11C 16/26* (2013.01); *G06F 2212/1016* (2013.01); *G06F 2212/7201* (2013.01); *G06F 2212/7211* (2013.01)

(58) Field of Classification Search
CPC ..... G06F 2212/1016; G06F 2212/7201; G06F 2212/7211
USPC ..................................................... 365/185.22
See application file for complete search history.

(56) References Cited

U.S. PATENT DOCUMENTS

| | | |
|---|---|---|
| 2016/0179386 A1 | 6/2016 | Zhang |
| 2019/0065093 A1* | 2/2019 | Karr ...................... G06F 3/0688 |
| 2021/0216474 A1* | 7/2021 | Muchherla .......... G06F 12/0253 |
| 2022/0147252 A1* | 5/2022 | Liu ....................... G06F 3/0652 |
| 2022/0261153 A1* | 8/2022 | Papa .................. G06F 12/0646 |

* cited by examiner

MEDIA MANAGEMENT OPERATIONS BASED ON HEALTH CHARACTERISTICS OF MEMORY CELLS

TECHNICAL FIELD

Embodiments of the disclosure relate generally to memory sub-systems, and more specifically, relate to media management operations based on health characteristics of memory cells.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
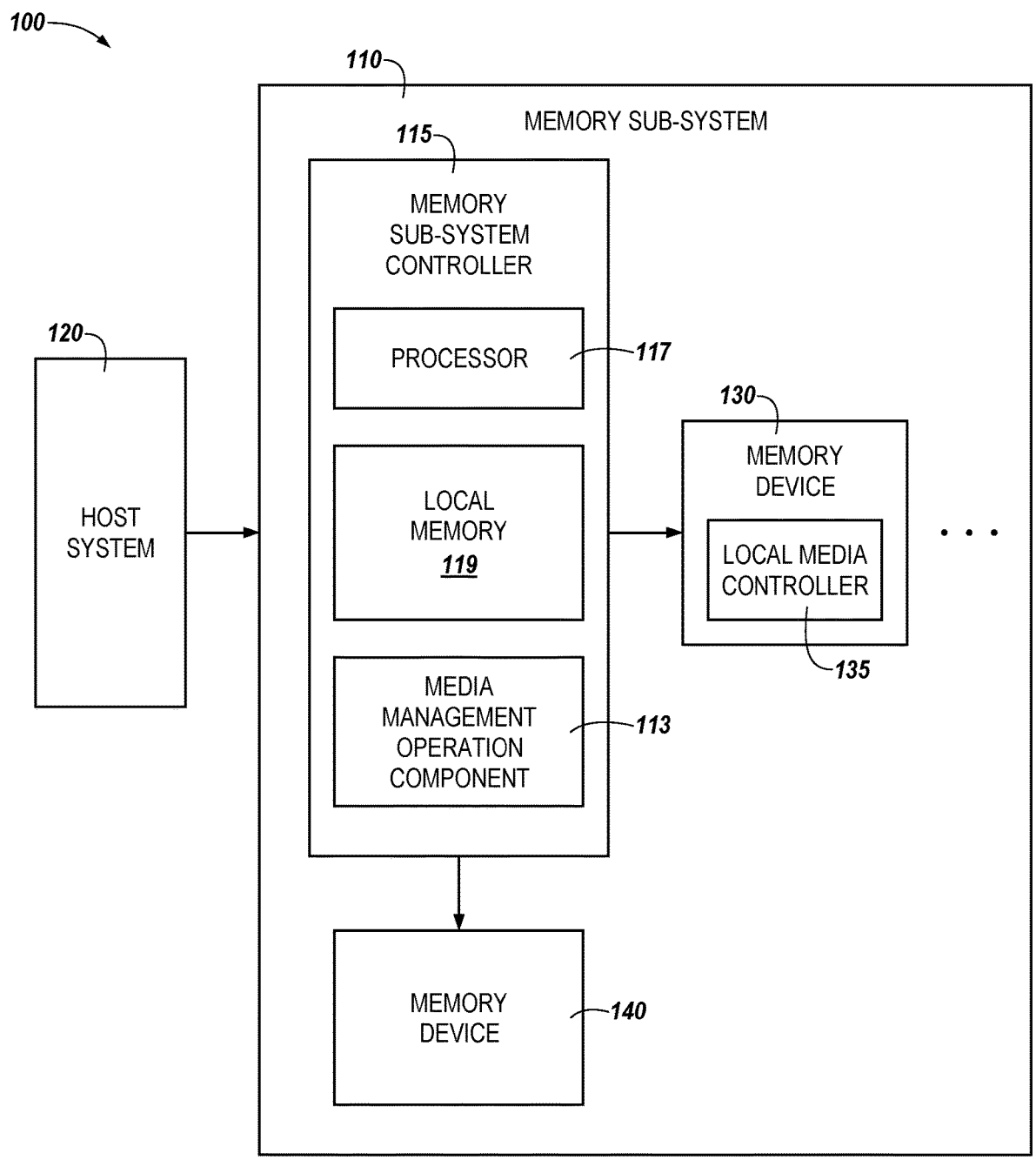
FIG. 1 illustrates an example computing system that includes a memory sub-system in accordance with some embodiments of the present disclosure.

Aspects of the present disclosure are directed to media management operations based on health characteristics of memory cells, in particular to memory sub-systems that include a media management operation component to perform media management operations based on health characteristics of memory cells of a memory sub-system. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

During operation of a memory sub-system, data (e.g., host data) can be written to the memory blocks. However, due to the behavior of flash-based memories, such as NAND, the written data can degrade over time and/or in response to data being written to neighboring memory blocks. Further, the physical memory cells included within the memory blocks can degrade over time due to data being written to and/or read from the memory cells. This phenomenon can lead to further degradation with respect to data stored in the memory cells, making data stored in some of the memory cells (e.g., memory cells that have been written to and/or read from greater than a threshold quantity of time) unreliable and, in some instances, unusable. In addition, over time, data stored by the memory sub-system can, over time, become stale (e.g., can become "cold"). In order to ensure that the data does not degrade to a point of being unusable and/or to ensure that the memory sub-system does not become overly full of stale data, media management operations can be performed on the memory blocks.

Non-limiting examples of media management operations can include error correction operations, wear leveling operations, write disturb mitigation operations, folding operations, and/or garbage collection operations. Media management operations can be performed in the "foreground" (e.g., during a time when a host is utilizing an interface associated with the memory sub-system and/or in the "background" (e.g., when the host is not utilizing the interface associated with the memory sub-system).

As used herein, a "folding operation" generally refers to the internal migration of data from one NAND location to another NAND location independent of any direct host interaction. Folding is performed to pack valid data together (e.g., via garbage collection), thereby freeing more space for new writes, for error avoidance, for wear leveling, and/or to restore RAIN parity protection in the event of an error. A folding operation can be performed by packing (e.g., copying) valid data into a free block and/or into storage locations in which data is stored with a higher density than SLC (e.g., from SLC cells to MLC, TLC, QLC, or PLC cells).

In some approaches, folding operations can be performed based on determining a quantity of valid physical translation units (PTUs) per block (e.g., a valid translation count (VTC)) and then selecting a block having the lowest VTC as a source block for the folding operation. Although such approaches can result in a low amount of folding effort (e.g., lower write amplification), such approaches can be inefficient and/or can require performance of a scan (e.g., a physical to logical scan or background scan, etc.), which can incur latencies and consume power.

Efficiency (e.g., an amount of bus traffic, an amount of computing overhead, etc.) associated with a media management operation such as a folding operation can vary. For instance, memory blocks can be filled with both valid data portions and invalid data portions. As used herein, "valid data portions" generally refer to data corresponding to a page having a current (e.g., up to date) logical to physical mapping entry, while "invalid data portions" generally refer to data corresponding to a page whose mapping entry is stale (e.g., the corresponding logical page has been remapped to a new physical page). Stated alternatively, valid data portions can generally include "cold data," while invalid data portions can generally include "hot data." The term "cold data," as used herein, generally refers to data or a block containing data that has not been accessed for a long duration relative to other data accessed from a memory sub-system or memory device. Conversely, the term "hot data," as used herein, generally refers to data or a block containing data that has been accessed frequently relative to other data accessed from a memory sub-system or memory device. Terms such as "pseudo-cold" generally refer to data or a block containing data that has been accessed less frequently than hot data but more frequently than cold data. Due to the behavior of write operations memory sub-systems, the valid data portions and invalid data portions can be dispersed at various locations within the memory block. Efficiencies associated with a media management operation can vary depending on a given dispersion of the valid data portions.

Additionally, efficiency of the media management operation can vary based on a type of media management operation (e.g., a foreground or background folding operation) to be performed on the source memory block. Thus, by not accounting for data dispersion and/or a type of media management operation, the memory sub-system can experience degraded performance with approaches that use VTC as a sole criterion for source block selection. This degradation of performance can be undesirable, especially in critical applications and/or in applications in demanding applications in which very high memory sub-system performance is expected. Further, this degraded performance that can be exhibited in such approaches can be further exacerbated in mobile (e.g., smartphone, internet of things, etc.) memory deployments in which an amount of space available to house a memory sub-system is limited in comparison to traditional computing architectures.

Aspects of the present disclosure address the above and other deficiencies by selectively performing media management operations (e.g., folding operations) based on a quantity of determined VTCs and health characteristics (which may be referred to herein in the alternative as "health metrics") associated with a block or collection of blocks of a memory sub-system. As used herein, "health characteristics" and "health metrics" generally refer to quantifiable attributes of memory cells in a memory block that correspond to the quality, life expectancy, or other attributes of the memory cells that can affect the ability of the memory cells to accurately store data. Non-limiting examples of health characteristics or health metrics can include a raw bit error rate (RBER) associated with the memory cells, wear leveling characteristics associated with the memory cells, and/or a total quantity of program erase cycles the memory cells have been subjected to, among others.

Embodiments described herein can determine if a ratio of observed VTCs compared to a total quantity of data portions for blocks of the memory sub-system are above or are below a threshold (e.g., a valid data portion threshold) and/or determine if health characteristics corresponding to VTCs and/or memory cells in which the VTCs are stored are above a threshold (e.g., a valid data health characteristic threshold), and selectively perform a media management operation, such as a folding operation, based on the determined ratio of observed VTCs compared to the total quantity of data portions for the block(s) and/or the determined health characteristics. In some embodiments, if the ratio of observed VTCs compared to a total quantity of data portions for the block(s) of the memory sub-system is above the threshold, a "blind refresh" operation in which all the data (e.g., valid data portions and invalid data portions) are subjected to the folding operation can be performed.

In some embodiments, if the ratio of valid data portions compared to the total quantity of data portions is greater than the valid data portion threshold but the health characteristics for the valid data portions are less than the valid data health characteristic threshold, a different media management operation, such as a NAND copyback operation, can be performed. As used herein, a "NAND copyback operation" generally refers to a folding operation in which data is read from a source memory block into internal NAND latches and then written to a destination memory block. In some embodiments, a NAND copyback operation can be performed without an ONFI transfer. In such embodiments, ONFI traffic can be reduced, thereby improving memory sub-system performance and reducing power consumption of the memory sub-system in comparison to operations that invoke an ONFI transfer.

Embodiments are not so limited, however, and in some embodiments, if the ratio of valid data portions compared to the total quantity of data portions is greater than the valid data portion threshold but the health characteristics for the valid data portions are greater than the valid data health characteristic threshold, yet a different media management operation, such as a refresh with system error correction capability (ECC) operation, can be performed. As used herein, a "refresh with system ECC operation" generally refers to an operation in which data is read from the source block, error corrected using one or more error detection and correction techniques, and written to a destination block. In such embodiments, the refresh with system ECC operation can be performed with one or more ONFI transfers. Such operations can incur larger performance penalties than, for example, a NAND copyback operation; however, reliability can be enhanced in comparison to some other media management operations.

If the ratio of observed VTCs compared to a total quantity of data portions for the block(s) of the memory sub-system is below the valid data portion threshold, a conventional folding operation in which only the valid data portions are subjected to the folding operation can be performed.

For clarity, when the health characteristics for the valid data portions are greater than the valid data health characteristic threshold, it means that the health of the valid data portions and/or the health of the memory cells in which the valid data portions are stored is relatively poor (e.g., they exhibit a high RBER, poor wear leveling characteristics, etc.). Conversely, when the health characteristics for the valid data portions are less than the valid data health characteristic threshold, it means that the health of the valid data portions and/or the health of the memory cells in which the valid data portions are stored is relatively good (e.g., they exhibit a low RBER, good wear leveling characteristics, etc.).

By selectively performing such media management operations, overall memory sub-system performance can be balanced with endurance concerns and benefits to improve the functioning of the memory sub-system in comparison to approaches that do not consider the ratio of observed VTCs compared to the total quantity of data portions for the blocks of the memory sub-system. For example, when the ratio of observed VTCs compared to the total quantity of data portions for the blocks is below the valid data portion threshold, conventional media management operations, which may incur lower performance and/or higher endurance benefits than a blind refresh, can be performed. However, since the ratio of observed VTCs compared to the total quantity of data portions in this scenario is relatively low, the performance reduction and/or endurance increase could be minimal. In contrast, when the ratio of observed VTCs compared to the total quantity of data portions for the blocks is above the valid data portion threshold, a blind refresh operation can be performed to improve performance at the expense of a reduction in endurance of the memory sub-system.

Further, by selectively performing such media management operations, overall memory sub-system performance can be balanced with endurance concerns and benefits to improve the functioning of the memory sub-system in comparison to approaches that do not consider the ratio of observed VTCs compared to the total quantity of data portions for the blocks of the memory sub-system and the health characteristics of the memory cells and/or VTCs. For example, when the health characteristics of the memory cells and/or VTCs is below the health characteristic threshold, conventional media management operations, which may incur lower performance and/or higher endurance benefits than a blind refresh, can be performed. However, if the health characteristics of the memory cells and/or the VTCs are above such a threshold, the performance reduction and/or endurance increase could be minimal. In contrast, when the health characteristics of the memory cells are lower than the threshold and the VTCs is above the health characteristic threshold, a NAND copyback operation can be performed to improve performance at the expense of a reduction in endurance of the memory sub-system. Further, if the health characteristics are above the threshold, media management operations including performance of a refresh operation with system error correction capability can be performed to improve reliability at the expense of a reduction in performance and endurance.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a media management operation component 113. Although not shown in FIG. 1 so as to not obfuscate the drawings, the media management operation component 113 can include various circuitry to determine that a ratio of valid data portions to a total quantity of data portions of a block of memory cells is greater than or less than a valid data portion threshold and determine that health characteristics for the valid data portions of the block of memory cells are greater than or less than a valid data health characteristic threshold. The management operation component 113 can further perform a first media management operation on the block of memory cells in response to determining that the ratio of valid data portions is greater than the valid data portion threshold, perform a second media management operation on at least a portion of the block of memory cells in response to determining that the ratio of valid data portions is less than the valid data portion threshold and the health characteristics for the valid data portions are greater than the valid data health characteristic threshold, and/or performing a third media management operation on the block of memory cells in response to determining that the ratio of valid data portions is less than the valid data portion threshold and the health characteristics for the valid data portions are less than the valid data health characteristic threshold.

In some embodiments, the media management operation component 113 can include special purpose circuitry in the form of an ASIC, FPGA, state machine, and/or other logic circuitry that can allow the media management operation component 113 to orchestrate and/or perform operations to selectively perform operations for the memory device 130 and/or the memory device 140 based on determined ratios of VTUs or VTCs.

In some embodiments, the memory sub-system controller 115 includes at least a portion of the media management operation component 113. For example, the memory sub-system controller 115 can include a processor 117 (processing device) configured to execute instructions stored in local memory 119 for performing the operations described herein. In some embodiments, the media management operation 113 is part of the host system 110, an application, or an operating system.

In a non-limiting example, an apparatus (e.g., the computing system 100) can include a media management operation component 113. The media management operation component 113 can be resident on the memory sub-system 110. As used herein, the term "resident on" refers to something that is physically located on a particular component. For example, the media management operation component 113 being "resident on" the memory sub-system 110 refers to a condition in which the hardware circuitry that comprises the media management operation component 113 is physically located on the memory sub-system 110. The term "resident on" may be used interchangeably with other terms such as "deployed on" or "located on," herein.

As mentioned above, the media management operation component 113 can be configured to determine that a ratio of valid translations unit counts (VTCs) compared to invalid translation unit counts of a block of memory cells (e.g., the block of memory cells 220 illustrated in FIG. 2 and/or the block of memory cells 320 illustrated in FIG. 3, herein) is greater than or less than a valid data portion threshold. As described in more detail in connection with FIG. 2 and FIG. 3, the valid data portion threshold can be based on a quantity of valid data portions (e.g., the data portions illustrated in FIG. 2 and FIG. 3 that are devoid of a hashing pattern) and a quantity of invalid data portions (e.g., the data portions illustrated in FIG. 2 and FIG. 3 that include a hashing pattern). In some embodiments, the valid data portion threshold can correspond to a percentage (e.g., 25%, 50%, 75%, 90%, 95%, etc.) of valid data portions versus invalid data portions or vice versa, although embodiments are not so limited.

In some embodiments, the media management operation component 113 can be configured to determine that health characteristics for the valid data portions of the block of memory cells are greater than or less than a valid data health characteristic threshold. In some embodiments, the block of memory cells can be a set of interleaved NAND memory cells that are coupled to a stackable cross-gridded array of memory cells.

The media management operation component 113 can be configured to cause performance of a first media management operation to consolidate a quantity of valid and/or invalid data portions within the block (e.g., within a selected block) in response to determining that the ratio of VTCs is greater than the valid data portion threshold and/or cause performance of a second media management operation on at least a portion of the block of memory cells in response to determining that the ratio of valid data portions is greater than the valid data portion threshold and the health characteristics for the valid data portions are less than the valid data health characteristic threshold. The consolidation of valid and/or invalid data portions within the block can be facilitated through the performance of media management operations, such as garbage collection operations. In some embodiments, the media management operation component 113 can be configured to cause performance of a third media management operation to consolidate the quantity of invalid data portions within the block in response to determining that the ratio of VTCs is less than the valid data portion threshold and the health characteristics for the valid data portions are less than the valid data health characteristic threshold.

Continuing with this example, the media management operation component 113 can cause performance of the first media management operation by causing each VTC and invalid data portions of the block of memory cells to be subjected to a folding operation. In some embodiments, the media management operation component 113 can cause performance of the second media management operation by reading data from invalid data portions of the block of memory cells into latches internal to a memory device with which the block of memory cells is associated and writing the data from the latches to a destination block of memory cells. That is, in some embodiments, the media management operation component 113 can cause performance of a NAND copyback operation as part of causing performance of the second media management operation. Further, in some embodiments, the media management operation component 113 can cause performance of the third media management operation by causing invalid data portions of the block of memory cells to be subjected to a folding operation.

As described in more detail, herein, the media management operation component 113 can cause performance of the first media management media operation or the second media management operation while refraining from causing performance of a media scan operation. An example of a media scan operation is a background media scan operation that can be performed in some approaches to determine whether or not to perform a media management operation on more or more portions of a memory sub-system. By refraining from performing such a scan, as contemplated herein, computing resources incurred in performance of such a scan operation, as well as the time incurred in performing a scan can be mitigated and, in some cases, eliminated. This can improve the latency and reduce the consumption of computing resources in comparison to approaches in which a media scan operation is performed This can reduce an amount of latency and/or an amount of power consumed in performance of the first and/or second media management operation.

In some embodiments, the media management operation component 113 can determine that the block of memory cells exhibits greater than a threshold media integrity and/or greater than a threshold wear leveling parameter and cause performance of the first media management operation in response to the determination. This can allow for fine-tuning of which memory cells are subjected to different media management operations to prolong the life of the memory sub-system. As used herein, the term "degraded media integrity" generally refers to a set of memory cells that have undergone greater than a threshold quantity of program-erase cycles and are therefore less robust than sets of memory cells that have undergone fewer than the threshold quantity of program erase cycles. Other non-limiting examples of degraded media integrity can include memory cells that have retained data for a long period of time, sets of memory cells that are subjected to high (or low) temperatures, etc.

In another non-limiting example, the memory sub-system 110 can include one or more memory components (e.g., the memory device 130 and/or the memory device 140) arranged to form a stackable cross-gridded array of a plurality of superblocks (e.g., the block 220 illustrated in FIG. 2 and/or the block 320 illustrated in FIG. 3, herein) of interleaved NAND memory cells. A processing device (e.g., the media management operation component 113) can be coupled to memory components and can perform operations including determining, in response to signaling received from the memory sub-system, that a ratio of valid translations unit counts (VTCs) to a quantity of invalid translation unit counts of a block of the interleaved NAND memory cells is greater than or less than a valid data portion threshold and determining that health characteristics for the valid data portions of the block of memory cells are greater than or less than a valid data health characteristic threshold.

The processing device can further perform operations including causing performance of a first media management operation to consolidate a quantity of valid and/or invalid data portions within the block of interleaved NAND memory cells in response to determining that the ratio of VTCs is greater than the valid data portion threshold, causing performance of a second media management operation on at least a portion of the block of memory cells in response to determining that the ratio of valid data portions is greater than the valid data portion threshold and the health characteristics for the valid data portions are less than the valid data health characteristic threshold, and/or causing performance of a third media management operation to consolidate the quantity of valid and/or invalid data portion within the block of interleaved NAND memory cells in response to determining that the ratio of VTCs is less than the valid data portion threshold.

The processing device is to further perform operations comprising determining that the ratio of VTCs to the quantity of invalid translation unit counts of the block of the interleaved NAND memory cells is greater than or less than a valid data portion threshold by monitoring a quantity of VTCs and invalid data portions dispersed across rows (e.g., the rows 225-1 to 225-Q illustrated in FIG. 2 and/or the rows 325-1 to 325-Q illustrated in FIG. 3, herein) associated with the block of the interleaved NAND memory cells and/or planes (e.g., the planes 222-1 to 222-P illustrated in FIG. 2 and/or the planes 322-1 to 322-P illustrated in FIG. 3, herein) associated with the block of the interleaved NAND memory cells.

In some embodiments, the processing device can further perform operations comprising performing the first media management operation by folding each VTC and each invalid data portion of the block of memory cells. That is, the processing device can, in some embodiments, cause performance of a blind refresh operation as part of performing the first media management operation. Further, processing device can further perform operations comprising causing data to be read from invalid data portions of the block of memory cells into latches internal to a memory device with which the block of memory cells is associated and causing the data to be written from the latches to a destination block of memory cells. That is, in some embodiments, the processing device can cause performance of a NAND copyback operation as part of causing performance of the second media management operation. Still further, in some embodiments, the processing device can perform operations comprising performing the third media management operation by folding only each invalid data portion of the block of memory cells.

The processing device can further perform operations including determining that the block of interleaved NAND memory cells exhibits degraded media integrity and/or greater than a threshold erase count and/or greater than a threshold wear leveling parameter, and causing performance of the first media management operation or the second media management operation in response to the determination.

Figure 2:
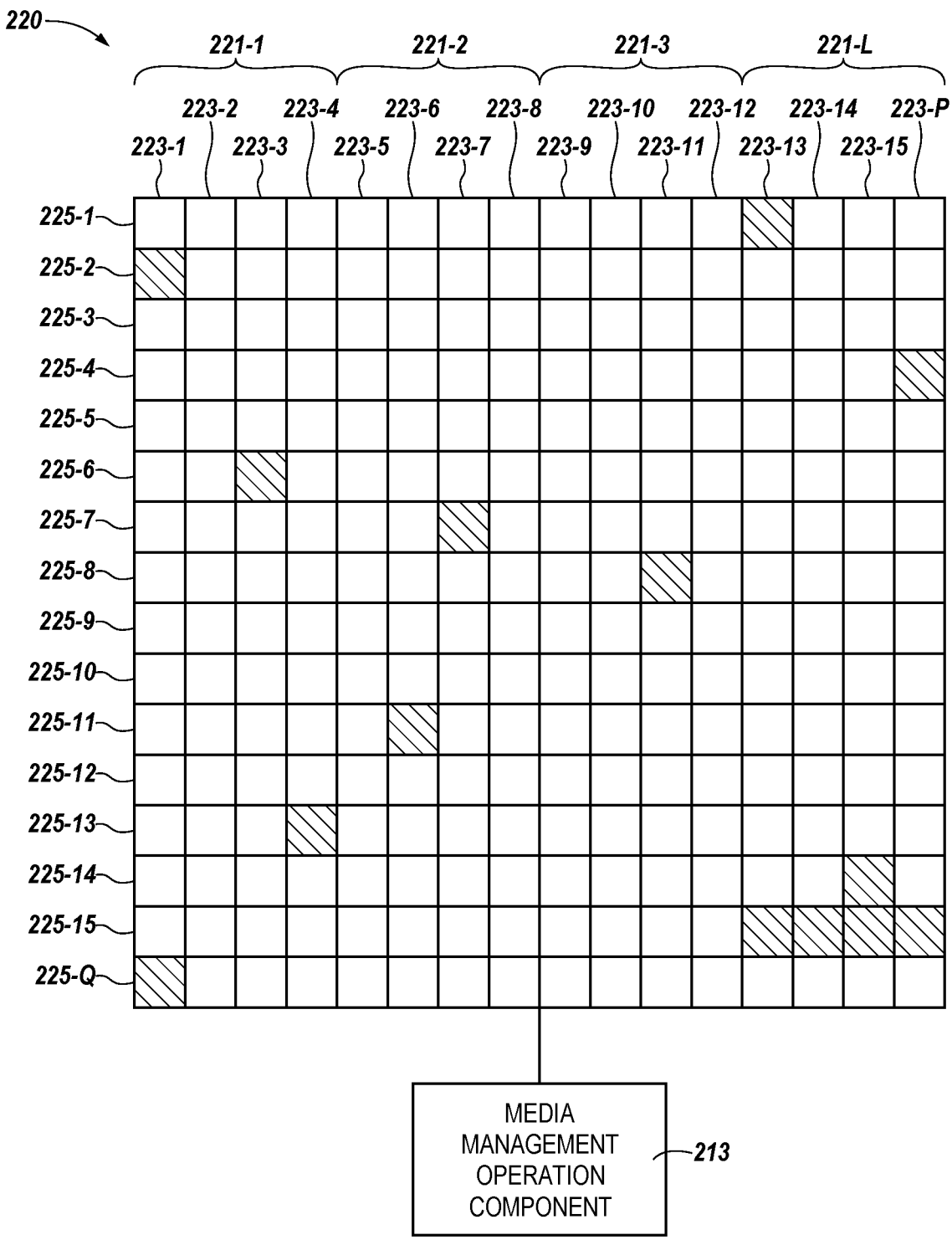
FIG. 2 illustrates an example block of memory cells in accordance with some embodiments of the present disclosure.

FIG. 2 illustrates an example block of memory cells 220 in accordance with some embodiments of the present disclosure. The block of memory cells 220 can be coupled to a media management operation component 213, which can be analogous to the media management operation component 113 illustrated in FIG. 1. As illustrated in FIG. 2, the block of memory cells 220 can be a superblock that spans multiple memory dice 221-1 to 221-L. The block of memory cells 220 can include multiple planes 223-1 to 223-P, and multiple pages 225-1 to 225-Q. Although not explicitly shown, the pages 225-1 to 225-Q can be coupled to word lines (e.g., access lines) and can, as is appropriate given the context, be referred to as word lines 225-1 to 225-Q, herein. In some embodiments, the block of memory cells 220 can include at least one set of interleaved NAND memory cells that are coupled to a stackable cross-gridded array of memory cells (e.g., a 3-D NAND device) and/or can be a portion of a replacement-gate NAND device.

As described above, memory cells, such as those in the block of memory cells 220, can include valid data portions (indicated by the absence of a hashing pattern) and invalid data portions (indicated by the presence of a hashing pattern). For instance, as illustrated in FIG. 2 the block of memory cells 220 can include a first invalid data portion (as identified by the hatched area located at die 221-1, plane 223-1, and page 225-2).

Similarly, the block of memory cells 220 can include an invalid data portion at die 221-L, plane 223-13, page 225-2; an invalid data portion at die 221-1, plane 223-3, page 225-6; an invalid data portion at die 221-1, plane 223-4, page 225-13; an invalid data portion die 221-3, plane 223-11, page 225-8; an invalid data portion at die 221-2, plane 223-6, page 225-11; an invalid data portion at die 221-L, plane 223-P, page 225-4; an invalid data portion at die 221-L, plane 223-15, page 225-14; an invalid data portion at die 221-L, plane 223-15, page 225-15; an invalid data portion at die 222-2, plane 223-7, page 225-7); an invalid data portion at die 222-1, plane 223-1, page 225-Q; an invalid data portion at die 221-L, plane 223-13, page 225-15; an invalid data portion at die 221-L, plane 223-24, page 225-15; and an invalid data portion at die 221-L, plane 223-P, and page 223-15.

That is, in the illustrative and non-limiting example shown in FIG. 2, the block of memory cells 220 (e.g., the superblock of memory cells) can include a total of fourteen distinct invalid data portions, whereas a remainder of the memory cells (e.g., the memory cells having at least a different die, plane, or page number identifier than the invalid data portions shown) in the block of memory cells 220 are valid data portions. Stated alternatively, the relative quantity of invalid data portions versus valid data portions shown in FIG. 2 is lower than, for example, the relative quantity of invalid data portions shown in FIG. 3. Accordingly, the illustrative example shown in FIG. 2 can correspond to a scenario in which the ratio of invalid data portions to valid data portions is less than a valid data portion threshold (or VTC threshold).

Further, in FIG. 2, the overall dispersion of the invalid data portions is relatively high (e.g., the invalid data portions are somewhat uniformly dispersed throughout the memory block 220). For example, the majority of invalid data portions in the memory block 220 lie within a single die 221-1 to 221-L, a single plane 223-1 to 223-P, or a single page 225-1 to 225-Q. This characteristic of having a relatively high dispersion of invalid data portions across the memory block 220 can also correspond to a scenario in which the ratio of invalid data portions to valid data portions is less than a valid data portion threshold (or VTC threshold). That is, fewer invalid data portions contained within a single die 221-1 to 221-L, a single plane 223-1 to 223-P, or a single page 225-1 to 225-Q can correspond to a lower ratio of invalid data portions to valid data portions, and hence, a valid data portion count that is lower than a valid data portion threshold (or VTC threshold).

Accordingly, scenarios such as the one illustrated in FIG. 2 (e.g., scenarios in which the ratio of invalid data portions to valid data portions is below a valid data portion threshold) can be candidate scenarios for performance of a media management operation in which only the invalid data portions are invoked. Accordingly, the media management operation component 213 can determine that the ratio of invalid data portions to valid data portions is below a valid data portion threshold and cause performance of a media management operation, such as a blind refresh operation, in which the invalid data portions are packed (e.g., copied) into a free block and/or into storage locations in which data is stored with a higher density than SLC (e.g., from SLC cells to MLC, TLC, QLC, and/or PLC cells).

In some embodiments, the media management operation component 213 can determine that health characteristics for the valid data portions of the block of memory cells are greater than or less than a valid data health characteristic threshold. For example, the media management operation component 213 can monitor the data portions (e.g., the valid data portions and/or the invalid data portions) to determine health characteristics corresponding to the memory cells in which the data portions are stored. As described above, the health characteristics can include a RBER associated with the memory cells, a quantity of program/erase cycles the memory cells have been subjected to, wear leveling characteristics of the memory cells, and/or error correction behavior associated with the memory cells, among others.

For example, the media management operation component 213 can determine that health characteristics of the memory cells associated with various data portions (e.g., the memory cells associated with a data portion at die 222-1, plane 223-1, page 225-1, the memory cells associated with a data portion at die 222-1, plane 223-2, page 225-1, the memory cells associated with a data portion at die 222-1, plane 223-3, page 225-1, and the memory cells associated with a data portion at die 222-1, plane 223-4, page 225-1) are greater than or less than a valid data health characteristic threshold. Embodiments are not so limited, however, and in some embodiments, the media management operation component 213 can determine that the memory cells associated with an entire memory die (e.g., the memory die 221-1), an entire plane (e.g., the plane 223-9) and/or an entire page (e.g., the page 225-5) have health characteristics that are greater than or less than the valid data health characteristic threshold. It will be further appreciated that, in some embodiments, the media management operation component 213 can determine that the memory cells associated with multiple memory dice (e.g., the memory die 221-1 and the memory die 221-3), multiple planes (e.g., the plane 223-9 and the plane 223-10) and/or multiple pages (e.g., the page 225-5 and the page 225-Q) have health characteristics that are greater than or less than the valid data health characteristic threshold. It will be still further appreciated that the memory management operation component 213 can determine that the memory cells associated with any combination of memory dice 221, planes 223, and/or pages 225, as well as portions and/or combinations thereof have health characteristics that are greater than or less than the valid data health characteristic threshold.

In some embodiments, if the memory management operation component 213 determines that the ratio of valid data portions to the total quantity of data portions is greater than the valid data portion threshold and the health characteristics for the valid data portions are less than the valid data health characteristic threshold, the memory management operation component 213 can cause performance of a media management operation in which data from invalid data portions of the block of memory cells are read into latches internal to a memory device with which the block of memory cells is associated and write the data from the latches to a destination block of memory cells in the absence of an ONFI communication. That is, in some embodiments, the media management operation component 213 can be configured to perform a NAND copyback operation in response to determining that that the ratio of valid data portions to the total quantity of data portions is less than the valid data portion threshold and the health characteristics for the valid data portions are greater than the valid data health characteristic threshold.

In some embodiments, if the memory management operation component 213 determines that the ratio of valid data portions to the total quantity of data portions is less than the valid data portion threshold and the health characteristics for the valid data portions are less than the valid data health characteristic threshold, the memory management operation component 213 can cause performance of a media management operation in which the invalid data portions are subjected to a folding operation. That is, in some embodiments, the media management operation component 213 can be configured to perform a conventional folding operation in response to determining that both the ratio of valid data portions to the total quantity of data portions is less than the valid data portion threshold and the health characteristics for the valid data portions are less than the valid data health characteristic threshold.

Figure 3:
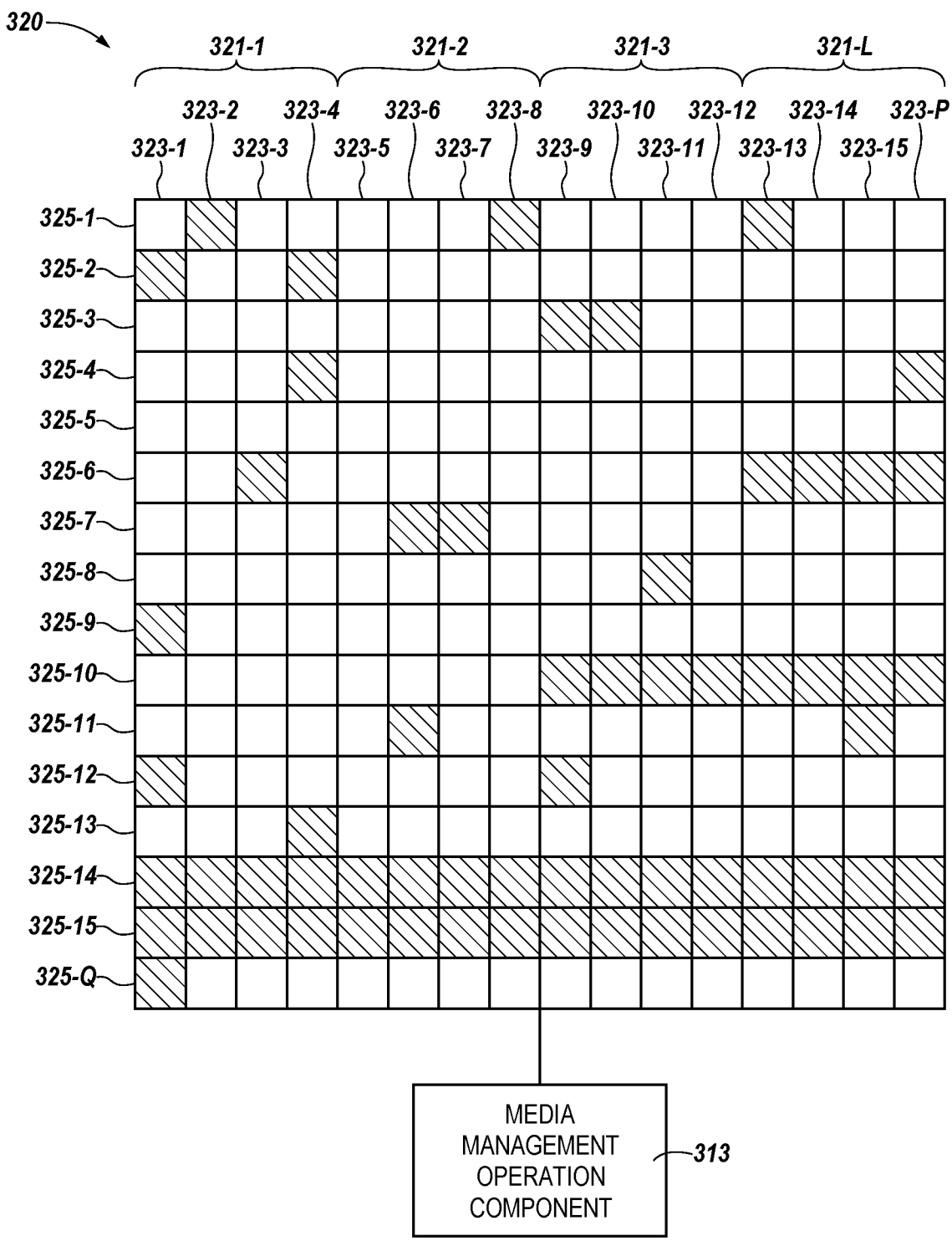
FIG. 3 illustrates another example block of memory cells in accordance with some embodiments of the present disclosure.

FIG. 3 illustrates another example block of memory cells 320 in accordance with some embodiments of the present disclosure. The block of memory cells 220 can be coupled to a media management operation component 213, which can be analogous to the media management operation component 113 illustrated in FIG. 1 and/or the media management operation component 213 illustrated in FIG. 2. As illustrated in FIG. 3, the block of memory cells 320 can be a superblock that spans multiple memory dice 321-1 to 321-L, which can be analogous to the memory dice 221-1 to 221-L illustrated in FIG. 2. The block of memory cells 320 can include multiple planes 323-1 to 323-P and multiple pages 325-1 to 325-Q, which can be analogous to the planes 223-1 to 223-P and pages 225-1 to 225-Q illustrated in FIG. 2.

As described above, memory cells, such as those in the block of memory cells 320, can include valid data portions (indicated by the absence of a hashing pattern) and invalid data portions (indicated by the presence of a hashing pattern). For instance, as illustrated in FIG. 3, the block of memory cells 320 can include an invalid data portion (as identified by the hatched area located at die 321-1, plane 323-1, and page 325-2), etc. In the interest of brevity, the lengthy recitation of which example memory cells shown are invalid that accompanies FIG. 2 will not be repeated in connection with the example of FIG. 3, however, the example memory cells that show invalid data portions in FIG. 3 will be appreciated in light of the description of FIG. 2.

The relative quantity of invalid data portions versus valid data portions shown in FIG. 3 is higher than, for example, the relative quantity of invalid data portions shown in FIG. 2. Accordingly, the illustrative example shown in FIG. 3 can correspond to a scenario in which the ratio of invalid data portions to valid data portions is greater than a valid data portion threshold (or VTC threshold).

Further, in FIG. 3, the overall dispersion of the invalid data portions is relatively low (e.g., the invalid data portions are somewhat non-uniformly dispersed throughout the memory block 220). For example, the invalid data portions in the memory block 220 lie across multiple dice 221-1 to 221-L, multiple planes 223-1 to 223-P, and/or multiple pages 225-1 to 225-Q. This characteristic of having a relatively low dispersion of invalid data portions across the memory block 220 can also correspond to a scenario in which the ratio of invalid data portions to valid data portions is greater than a valid data portion threshold (or VTC threshold). That is, more invalid data portions contained across multiple dice 221-1 to 221-L, multiple planes 223-1 to 223-P, and/or multiple pages 225-1 to 225-Q can correspond to a higher ratio of invalid data portions to valid data portions, and hence, a valid data portion count that is greater than a valid data portion threshold (or VTC threshold).

Accordingly, scenarios such as the one illustrated in FIG. 3 (e.g., scenarios in which the ratio of invalid data portions to valid data portions is above a valid data portion threshold) can be candidate scenarios for performance of a media management operation in which both the valid data portions and the invalid data portions are invoked (e.g., a blind refresh operation). Accordingly, the media management operation component 313 can determine that the ratio of invalid data portions to valid data portions is above a valid data portion threshold and cause performance of a media management operation in which both the valid data portions and the invalid data portions are packed (e.g., copied) into a free block and/or into storage locations in which data is stored with a higher density than SLC (e.g., from SLC cells to MLC, TLC, QLC, and/or PLC cells).

Figure 4:
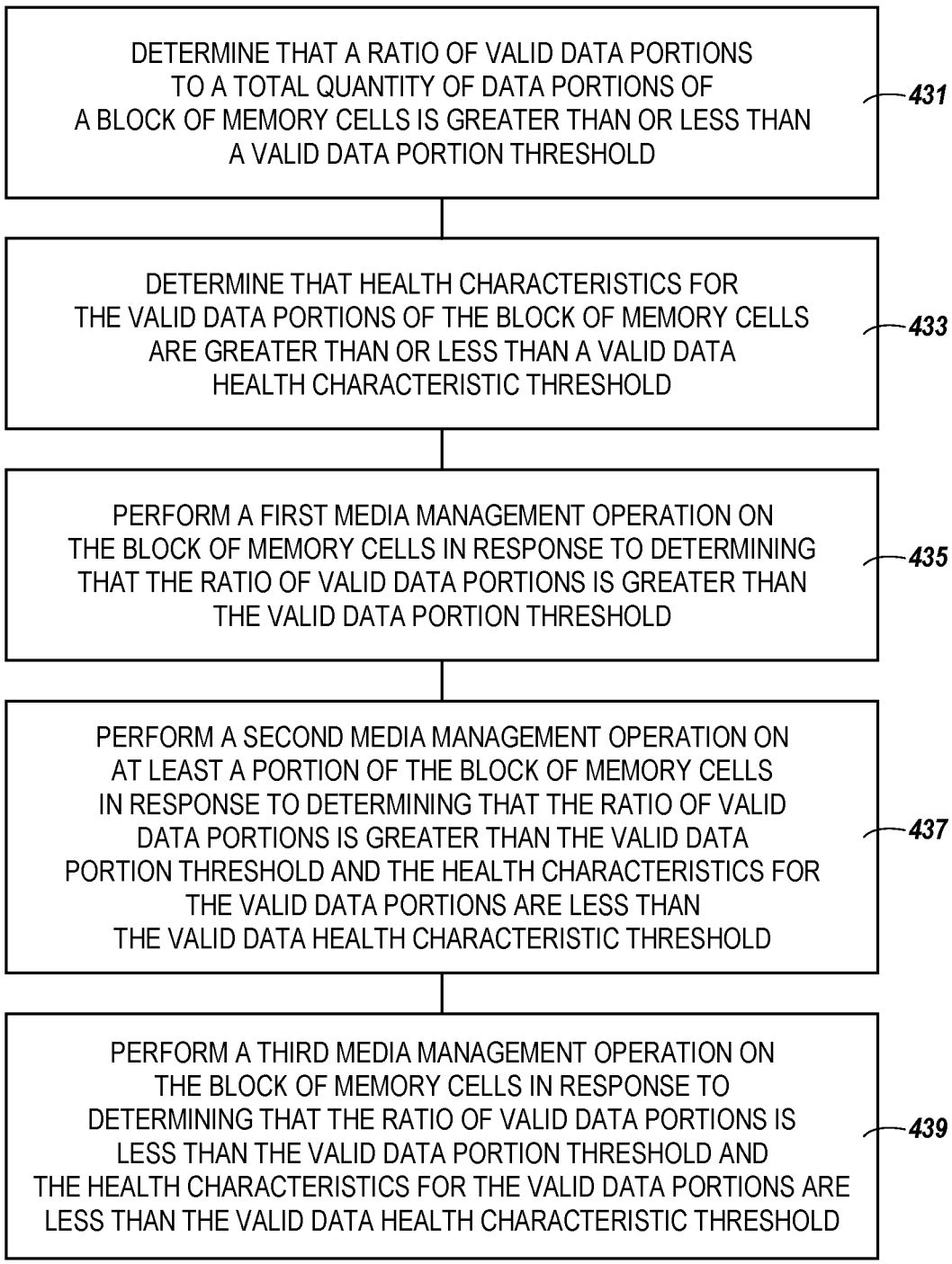
FIG. 4 is a flow diagram corresponding to a method for media management operations based on health characteristics of memory cells in accordance with some embodiments of the present disclosure.

FIG. 4 is flow diagram corresponding to a method 430 for memory dice arrangement in accordance with some embodiments of the present disclosure. The method 430 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 430 is performed by the media management operation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 431, whether a ratio of valid data portions to a total quantity of data portions of a block of memory cells is greater than or less than a valid data portion threshold is determined. The valid data portions can be valid translation unit counts (VTCs), such as the data portions illustrated in FIG. 2 and FIG. 3 that are devoid of a hashing pattern.

At operation 433, whether health characteristics for the valid data portions of the block of memory cells are greater than or less than a valid data health characteristic threshold is determined. In some embodiments, the health characteristics can include at least one of a raw bit error rate (RBER) or a quantity of program/erase cycles associated with the valid data portion. Embodiments are not so limited, however, and other health characteristics, such as memory wear, read/write disturb error behavior exhibited by memory cells in which data portions (e.g., valid and/or invalid data portions) are written, and/or error correction behavior of the memory cells, among others.

At operation 435, a media management operation on the block of memory cells is performed in response to determining that the ratio of valid data portions is greater than the valid data portion threshold. The invalid data portions can be analogous to the data portions illustrated in FIG. 2 and FIG. 3 that include a hashing pattern. In some embodiments, this media management operation can be performed by folding each valid data portion and each invalid data portion of the block of memory cells. That is, in some embodiments, a blind refresh operation can be performed in connection with operation 435.

At operation 437, a different media management operation on at least a portion of the block of memory cells is performed in response to determining that the ratio of valid data portions is greater than the valid data portion threshold and the health characteristics for the valid data portions are less than the valid data health characteristic threshold. In some embodiments, this media management operation can be performed by reading data from invalid data portions of the block of memory cells into latches internal to a memory device with which the block of memory cells is associated and writing the data from the latches to a destination block of memory cells in the absence of an ONFI communication. That is, in some embodiments, a NAND copyback operation can be performed in connection with operation 437.

In some embodiments, either or both of the media management operations described at operations 435 and 437 can be performed in the absence of an operation involving a physical-to-logical mapping data structure and/or a logical-to-physical mapping data structure to identify valid data locations with a block of memory cells. An example of a operation involving a physical-to-logical mapping data structure and/or a logical-to-physical mapping data structure to identify valid data locations with a block of memory cells is a background media scan operation that can be performed in some approaches to determine whether or not to perform a media management operation on one or more portions of a memory sub-system. By refraining from performing such a scan, as contemplated herein, computing resources incurred in performance of such a scan operation, as well as the time incurred in performing a scan can be mitigated and, in some cases, eliminated. This can improve the latency and reduce the consumption of computing resources in comparison to approaches in which an operation involving a physical-to-logical mapping data structure and/or a logical-to-physical mapping data structure to identify valid data locations with a block of memory cells is performed.

At operation 439, another different media management operation on the block of memory cells is performed in response to determining that the ratio of valid data portions is less than the valid data portion threshold and the health characteristics for the valid data portions are less than the valid data health characteristic threshold. In some embodiments, this media management operation can be performed by folding each invalid data portion of the block of memory cells. That is, in some embodiments, a conventional folding operation can be performed in connection with operation 439.

Figure 5:
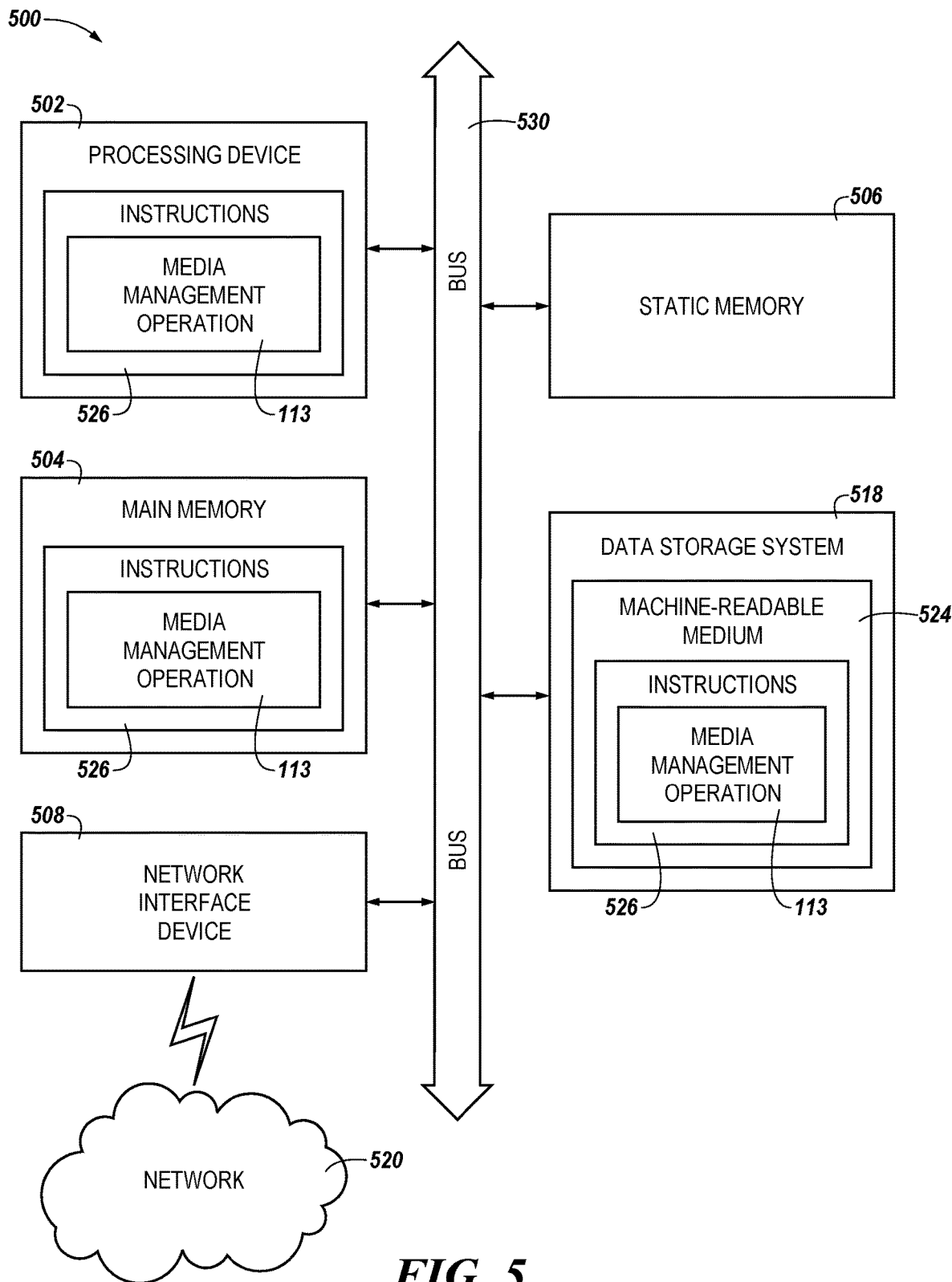
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the media management operation component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 408 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a media management operation component (e.g., the media management operation component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
   determining that a ratio of valid data portions to a total quantity of data portions of a block of memory cells is greater than or less than a valid data portion threshold;
   determining that health characteristics for the valid data portions of the block of memory cells are greater than or less than a valid data health characteristic threshold;
   performing a first media management operation on the block of memory cells in response to determining that the ratio of valid data portions to the total quantity of data portions is greater than the valid data portion threshold;
   performing a second media management operation on at least a portion of the block of memory cells in response to determining that the ratio of valid data portions to the total quantity of data portions is greater than the valid data portion threshold and the health characteristics for the valid data portions are less than the valid data health characteristic threshold; and
   performing a third media management operation on the block of memory cells in response to determining that the ratio of valid data portions to the total quantity of data portions is less than the valid data portion threshold and the health characteristics for the valid data portions are less than the valid data health characteristic threshold.

2. The method of claim 1, further comprising performing the first media management operation by folding each valid data portion and each invalid data portion of the block of memory cells.

3. The method of claim 1, further comprising performing the second media management operation by:
   reading data from invalid data portions of the block of memory cells into latches internal to a memory device with which the block of memory cells is associated; and
   writing the data from the latches to a destination block of memory cells in the absence of an ONFI communication.

4. The method of claim 1, further comprising performing the third media management operation by folding each invalid data portion of the block of memory cells.

5. The method of claim 1, wherein the valid data portions comprise valid translation units.

6. The method of claim 1, wherein the health characteristics include at least one of a raw bit error rate or a quantity of program/erase cycles, or both associated with the valid data portion.

7. The method of claim 1, further comprising performing the first media management operation or the second media management operation, or both, in the absence of performing an operation involving a physical-to-logical mapping data structure and/or a logical-to-physical mapping data structure to identify valid data locations with the block of memory cells.

8. An apparatus, comprising:
   a media management operation component to:
      determine that a ratio of valid translations unit counts (VTCs) to invalid translation unit counts of a block of memory cells is greater than or less than a valid data portion threshold;
      determine that health characteristics for the valid data portions of the block of memory cells are greater than or less than a valid data health characteristic threshold;
      cause performance of a first media management operation to consolidate a quantity of invalid data portions within the block in response to determining that the ratio of VTCs to invalid translation unit counts is greater than the valid data portion threshold;
      cause performance of a second media management operation on at least a portion of the block of memory cells in response to determining that the ratio of valid data portions to invalid translation unit counts is greater than the valid data portion threshold and the health characteristics for the valid data portions are less than the valid data health characteristic threshold; and cause performance of a third media management operation to reduce the quantity of invalid data portions within the block in response to determining that the ratio of VTCs to invalid translation unit counts is less than the valid data portion threshold and the health characteristics for the valid data portions are less than the valid data health characteristic threshold.

9. The apparatus of claim 8, wherein the block of memory cells comprises a set of interleaved NAND memory cells that are coupled to a stackable cross-gridded array of memory cells.

10. The apparatus of claim 8, wherein the media management operation component is to cause performance of the first media management operation by causing each VTC and invalid data portions of the block of memory cells to be subjected to a folding operation.

11. The apparatus of claim 8, wherein the media management operation component is to cause performance of the second media management operation by:
    reading data from invalid data portions of the block of memory cells into latches internal to a memory device with which the block of memory cells is associated; and
    writing the data from the latches to a destination block of memory cells.

12. The apparatus of claim 8, wherein the media management operation component is to cause performance of the third media management operation by causing invalid data portions of the block of memory cells to be subjected to a folding operation.

13. The apparatus of claim 8, wherein the media management operation component is to cause performance of the first media management media operation or the second media management operation while refraining from causing performance of an operation involving a physical-to-logical mapping data structure and/or a logical-to-physical mapping data structure to identify valid data locations with a block of memory cells.

14. The apparatus of claim 8, wherein the media management operation component is to:
    determine that the block of memory cells exhibits greater than a threshold media integrity or greater than a threshold wear leveling parameter, or both; and
    cause performance of the first media management operation in response to the determination.

15. A system, comprising:
    a plurality of memory components arranged to form a stackable cross-gridded array of a plurality of superblocks of interleaved NAND memory cells; and
    a processing device coupled to the plurality of memory components, wherein the processing device is configured to:
        determine, in response to signaling received from the memory sub-system, that a ratio of valid translations unit counts (VTCs) to a quantity of invalid translation unit counts of a block of the interleaved NAND memory cells is greater than or less than a valid data portion threshold;
        determine that health characteristics for the valid data portions of the block of memory cells are greater than or less than a valid data health characteristic threshold;
        cause performance of a first media management operation to reduce a quantity of invalid data portions within the block of interleaved NAND memory cells in response to determining that the ratio of VTCs to the quantity of invalid translation unit counts is greater than the valid data portion threshold;
        cause performance of a second media management operation on at least a portion of the block of memory cells in response to determining that the ratio of VTCs to the quantity of invalid translation unit counts is greater than the valid data portion threshold and the health characteristics for the valid data portions are less than the valid data health characteristic threshold; and
        cause performance of a third media management operation to reduce the quantity of invalid data portion within the block of interleaved NAND memory cells in response to determining that the ratio of VTCs to the quantity of invalid translation unit counts is less than the valid data portion threshold.

16. The system of claim 15, wherein the processing device is further configured to:
    determining that the block of interleaved NAND memory cells exhibits greater than a threshold media integrity or greater than a threshold wear leveling parameter, or both; and
    causing performance of the first media management operation or the second media management operation in response to the determination.

17. The system of claim 15, wherein the processing device is further configured to perform the first media management operation by folding each VTC and each invalid data portion of the block of memory cells.

18. The system of claim 15, wherein the processing device is further configured to:
    cause data to be read from invalid data portions of the block of memory cells into latches internal to a memory device with which the block of memory cells is associated; and
    cause the data to be written from the latches to a destination block of memory cells.

19. The system of claim 15, wherein the processing device is further configured to perform the third media management operation by folding only each invalid data portion of the block of memory cells.

20. The system of claim 15, wherein the processing device is further configured to determine that the ratio of VTCs of the block of the interleaved NAND memory cells is greater than or less than a valid data portion threshold by monitoring a quantity of VTCs and invalid data portions dispersed across rows associated with the block of the interleaved NAND memory cells or planes associated with the block of the interleaved NAND memory cells, or both.

* * * * *